June 1, 1965 A. R. HABAYEB 3,187,194

MONOSTABLE TUNNEL DIODE LOGIC CIRCUIT WITH THE OUTPUT PULSE AMPLITUDE PROPORTIONAL TO THE INPUT PULSE AMPLITUDE

Filed Dec. 29, 1960 2 Sheets-Sheet 1

INVENTOR.
ABDUL R. HABAYEB

BY Fred Jacob

ATTORNEY

June 1, 1965 A. R. HABAYEB 3,187,194

MONOSTABLE TUNNEL DIODE LOGIC CIRCUIT WITH THE OUTPUT PULSE AMPLITUDE PROPORTIONAL TO THE INPUT PULSE AMPLITUDE

Filed Dec. 29, 1960 2 Sheets-Sheet 2

INVENTOR.
ABDUL R. HABAYEB

BY Fred Jacob

ATTORNEY 3,187,194

MONOSTABLE TUNNEL DIODE LOGIC CIRCUIT WITH THE OUTPUT PULSE AMPLITUDE PROPORTIONAL TO THE INPUT PULSE AMPLITUDE

Abdul R. Habayeb, Lawrence, Kans., assignor to Honeywell Inc., a corporation of Delaware Filed Dec. 29, 1960, Ser. No. 79,319
20 Claims. (Cl. 307—88.5)

The present invention relates in general to new and improved logical circuits, in particular to multi-stable circuits which are capable of performing logical functions with the aid of tunnel diodes. A multi-stable circuit, as defined herein, is one which is capable of existing in more than two stable states.

Tunnel diodes, which consist of thin, highly-doped semiconductor junctions, are finding increased employment in logical circuitry of the kind used in high-speed computers. One of the reasons for the extensive use of tunnel diodes is their high switching speeds which is more than fifty times that of the fastest presently available transistors. Of even greater importance, is the relative simplicity and economy of tunnel diode circuits which are capable of performing logic functions heretofore carried out by conventional circuits using at least one transistor and/or one or more diodes.

The reason tunnel diodes lend themselves to such applications, is to be found in the current-voltage characteristic of a typical tunnel diode which displays a negative resistance range located between a pair of positive resistance regions and separated from the latter by a pair of instability points. These instability points have corresponding peak and valley diode current levels which, when passed, cause the diode operation to switch substantially instantaneously to a different positive resistance region of the diode characteristic. Stable diode operation can occur only in the positive resistance regions of the diode characteristic. The diode may be switched between different positive resistance regions in response to the application of a trigger pulse.

To date, relatively little work has been done on circuits which employ a plurality of series-connected tunnel diodes. The characteristic of such a circuit is a composite of the individual diode characteristics. Thus, where the series-connected diodes are poled to conduct current in the same direction, the composite circuit characteristic contains $n+1$ positive resistance regions, where $n$ is the number of series-connected diodes. Since stable operation is possible in the positive resistance regions, the number of stable operating regions of such a circuit can, within practical limitations, be increased at will by merely adding tunnel diodes in series. This property is of great potential value, particularly where a circuit logic other than binary logic is employed to carry out computations. Thus, it can be shown that great savings are possible in the number of circuit components required to carry out certain computations if a number system having the base of 3 is adopted and a circuit which is tristable is used. Still other computations are carried out most economically with a decimal numbering system which would advantageously employ a circuit having ten stable states.

Heretofore, a number of obstacles have prevented the extensive use of such multistable circuits, i.e., circuits which have more than two stable states. Presently available circuits are ambiguous in operation in the sense that a given input signal corresponds to more than one operating point on the composite characteristic. Further, such circuits are incapable of providing any appreciable logical gain. In addition, the circuit requires a separate resetting signal to restore it to its original state upon the termination of an input pulse. Such different kinds of input pulses are required depending upon the stable state in which circuit operation is desired, different kinds of resetting pulses are also required. Not only must the resetting pulses be synchronized with the input pulses in order to take full advantage of the rapid switching speeds of the tunnel diodes, but the effects of ambiguous circuit operation must be considered during the restoring phase as well as during the initial switching phase of the circuit. As a result, presently available tunnel diode logic circuits which are capable of operating in more than two stable states have neither proven economically feasible heretofore, nor sufficiently reliable to be practical.

It is a primary object of this invention to provide multistable logic circuits which overcome the foregoing disadvantages.

It is another object of this invention to provide multistable logic circuits which employ tunnel diodes and are capable of operating without ambiguity.

It is a further object of this invention to provide multistable, tunnel diode logic circuits which have substantial logical gain.

It is an additional object of this invention to provide multistable, tunnel diode logic circuits which are capable of restoring themselves to the initial operating point upon the termination of the input signal without any external stimulus.

The various novel features which characterize the invention are pointed out with particularity in the claims annexed to and forming a part of this specification. The invention itself, its operation, its advantages and specific objects thereof, will be understood with reference to the following detailed description and the accompanying drawings in which:

In its simplest form, the invention contemplates the multiple use of series-connected tunnel diodes having a composite circuit characteristic composed of the individual diode characteristics. With proper biasing, the application of different trigger pulses, each representing a unique amplitude and polarity combination, makes it possible to shift the circuit operation to different positive resistance regions of the composite characteristic each capable of supporting stable circuit operation. Accordingly, the invention which forms the subject matter of this application provides multistable circuit operation in accordance with the number of tunnel diodes which are connected in series.

Figure 1:
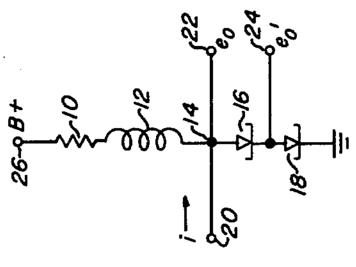
FIGURE 1 illustrates a preferred embodiment of the invention.

With reference now to the drawings, FIGURE 1 illustrates a preferred embodiment of the invention which, for the sake of simplicity, has been limited to a pair of series-connected tunnel diodes. A resistive impedance 10 is connected in series with an inductive impedance 12, the latter in turn being connected to junction point 14. A pair of like-poled tunnel diodes 16 and 18 are connected in series with each other between the junction point 14 and ground, with the anode of the diode 16 connected to the junction point, and the cathode of the diode 18 connected to ground, as shown. An input terminal 20 is connected to the junction point 14 and is adapted to receive input signals. For the purpose of illustration, the input signal is designated as input current pulses $i$ which are derived from a current source, i.e., a source having a relatively high internal resistance. It will be understood that different kinds of input sources may be used, e.g., a voltage source of relatively low internal resistance which supplies input voltage pulses. An output signal $e_o$ is derived from a first output terminal 22 which is connected to the junction point 14. Another output terminal 24 is connected to the anode of the diode 18 and is adapted to provide output signals $e_o'$. A D.C. bias source B+ which has a relatively low internal resistance is coupled to a terminal 26 of the resistive impedance 10 and applies a bias voltage between the latter and ground.

Figure 2:
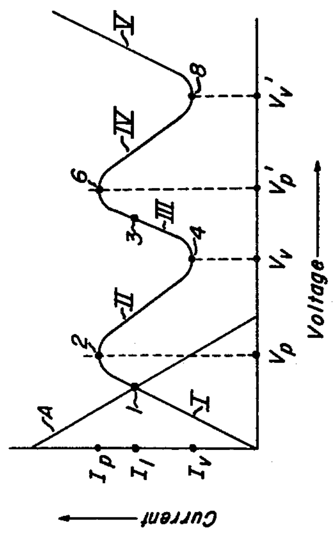
FIGURE 2 illustrates the composite diode characteristic of the embodiment of FIGURE 1 for identical tunnel diodes.

If the diodes 16 and 18 of FIGURE 1 are chosen so as to have identical current-voltage characteristics, they will have identical peak currents for a given applied voltage. The composite characteristic of such a circuit is illustrated in FIGURE 2 and is seen to include a pair of negative resistance ranges II and IV bordered by positive resistance regions I. III and V respectively. The negative and positive resistance areas are separated from each other by the peak instability points 2 and 6 and by the valley instability points 4 and 8. The composite characteristic therefor provides $n+1$ positive resistance regions in which stable circuit operation is possible, where $n$ is the number of like-poled diodes connected in series in the circuit. Accordingly, the circuit is adapted for tristable operation, i.e., depending on the amplitude of the applied input signal, the output signal $e_o$ will have one of three stable voltage levels.

It will be noted that identical peak currents $I_P$ are obtained at the instability points 2 and 6 for an applied voltage $V_P$ or $V_P'$ respectively. Similarly, identical valley currents $I_V$ are obtained at the instability points 4 and 8 for an applied voltage signal of $V_V$ or $V_V'$ respectively. In order for the circuit to operate without any ambiguity, it follows that the input signal source provide input voltage pulses, i.e., it must approach a voltage source having a relatively low internal resistance. If a current source is used for the input signals, current input pulses are applied to the input terminal 20 of the circuit of FIGURE 1 and the circuit operation will be ambiguous. Specifically, if the circuit is biased for monostable operation and a current input pulse having an amplitude $I_1$ is applied, it will not be possible to distinguish whether the circuit operation is at the point 1 or at the point 3 of the composite characteristic. Successful tristable circuit operation is further dependent on the proper choice of the series circuit resistance and on the applied bias voltage so that the circuit is biased for monostable diode operation. In the latter case, the load line, e.g., the load line A, intersects the composite characteristic in only one positive resistance region. Tristable circuit operation is impossible if the load line intersects the composite characteristic more than once.

Figure 3:
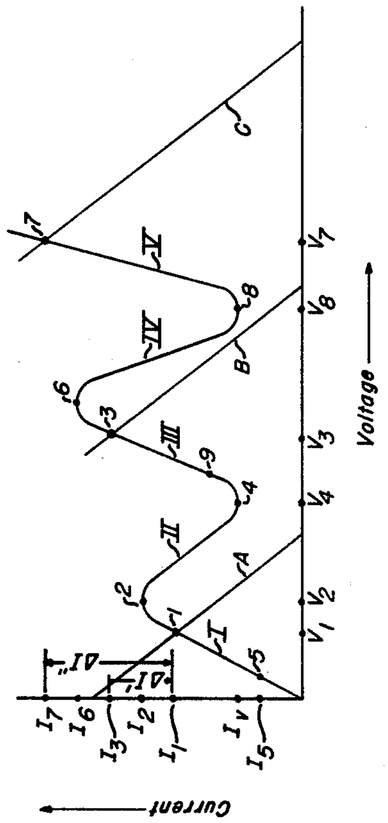
FIGURE 3 illustrates the composite diode characteristic of the circuit of FIGURE 1 for tunnel diodes which have different individual characteristics.

In view of the above-discussed restrictions on the circuit operation, the scope of application of a circuit having identical tunnel diodes is severely limited. FIGURE 3 illustrates the composite characteristic of the embodiment of FIGURE 1 for the case where the diodes 16 and 18 are chosen to have different characteristics. Applicable reference numerals have been carried over from FIGURE 2. The diodes are seen to have different peak current levels, preferably for the same valley current levels and for identical voltage swings. Specifically, the instability points 2 and 6 have corresponding peak current levels $I_2$ and $I_6$ respectively, while the instability points 4 and 8 have the same valley current level $I_V$. The voltage swings which correspond to the points 4 and 8 are identical so that $V_8=2V_4$. It is not material to the operation of the circuit which one of the two diodes is represented by a particular portion of the composite characteristic. For the sake of illustration, however, let the diode 18 have the smaller peak current level which may be represented by the resistance regions I, II and III.

Although the subsequent discussion of the circuit operation is confined to an input current source, it will be understood that the composite characteristic of FIGURE 3 enables the circuit shown in FIGURE 1 to accept either voltage or current input pulses. The resistive impedance 10 and the applied positive D.C. bias B+ are chosen to provide a load line A which intersects the composite characteristic at a point 1 to define the steady state circuit conditions. The steady state voltage across the diode combinations 16 and 18 is seen to be $V_1$ and the steady state current flowing through both diodes is $I_1$.

As previously explained, stable circuit operation is possible in any one of the positive resistance regions I, III and V respectively. The steady state conditions which are designated by the operating point 1 thus constitute the first one of the three stable states of the circuit of FIGURE 1. In order to switch the circuit to one of the other stable states, e.g., the operating point 3 in the positive resistance region III, or the operating point 7 in the positive resistance region V, different input trigger pulses are required. If a positive trigger pulse having an amplitude $\Delta I'$ is applied to the input terminal 20, only the diode 18 is affected while the operation of the diode 16 remains unchanged since its peak current is not exceeded. On the composite diode characteristic of FIGURE 3, the operating point first shifts to the instability point 2 and thereafter switches substantially instantaneously to the operating point 3 whose corresponding current level $I_3$ is equal to the sum of the steady state current value $I_1$ and the pulse current $\Delta I'$.

The circuit is maintained at the stable operating point 3 for the duration of the pulse in what may be termed its second stable state. Upon the pulse termination, the current in the series diode combination 16 and 18 at first decreases at a rate governed by the time constant of the circuit until it falls below the level $I_4$ which corresponds to the instability point 4. The circuit operation then switches substantially instantaneously from point 4 to point 5 which has a corresponding current value $I_5$. More specifically, the diode 18 is switched back to the positive resistance region I. Thereafter, the diode current increases at the time constant rate until it again reaches the steady state operating point 1.

It will be noted from the foregoing operation, that the circuit is self-resetting, i.e., it reverts to the original steady state conditions in response to the termination of the input pulse without requiring any external stimulus. The primary function of the inductance 12 in this operation is to determine the logical gain as will become apparent hereinafter in connection with a consideration of FIGURE 4.

The inductance further aids the circuit operation by opposing an instantaneous energy transfer for a sufficient time period to enable the diode combination to switch from one positive resistance region to another. Specifically, at the end of the pulse period, the inductance opposes a rapid increase of the current flowing through it for a time period sufficiently long to enable the diode current to decrease below the valley level $I_V$ which corresponds to the instability point 4, so as to cause the diode 18 to switch back to the positive resistance region I. A more detailed explanation of the theory of operation of self-resetting circuits will be found in two copending applications by the applicant of the present invention, Serial Number 68,882 and Serial Number 68,883 respectively, both filed on November 4, 1960 and assigned to the assignee of this application, both now abandoned.

If it is desired to switch the circuit to its third stable state, i.e. to the state where the diodes 16 as well as 18 are switched, a positive input pulse having an amplitude $\Delta I''$ is applied to the input terminal 20 so that the total current flowing through the diode combination is $I_7$. As in the case above, the operating point is first shifted from the steady state point 1 to the instability point 2. Due to the amplitude of the applied current pulse, however, the operating point is never permitted to switch to the positive resistance region III, but switches directly to the positive resistance region V. The current level $I_7$, i.e., the amplitude of the current flowing in the diode which corresponds to the operating point 7 in the positive resistance region V, is sufficiently large to compel both diodes 16 and 18 to switch.

The circuit remains in its third stable state, i.e., at the operating point 7, for the duration of the pulse. The inductance 12 opposes any instantaneous energy transfer and thus prevents the diode current from increasing rapidly when the applied input pulse ceases. The diode current decreases at a rate governed by the circuit time constant until it reaches the valley level $I_V$ corresponding to the instability point 8. The operating point thereupon switches substantially instantaneously to the point 5 in the positive resistance region I of the composite characteristic and thereafter moves back to the initial steady state point at a rate determined by the circuit time constant.

Figure 4:
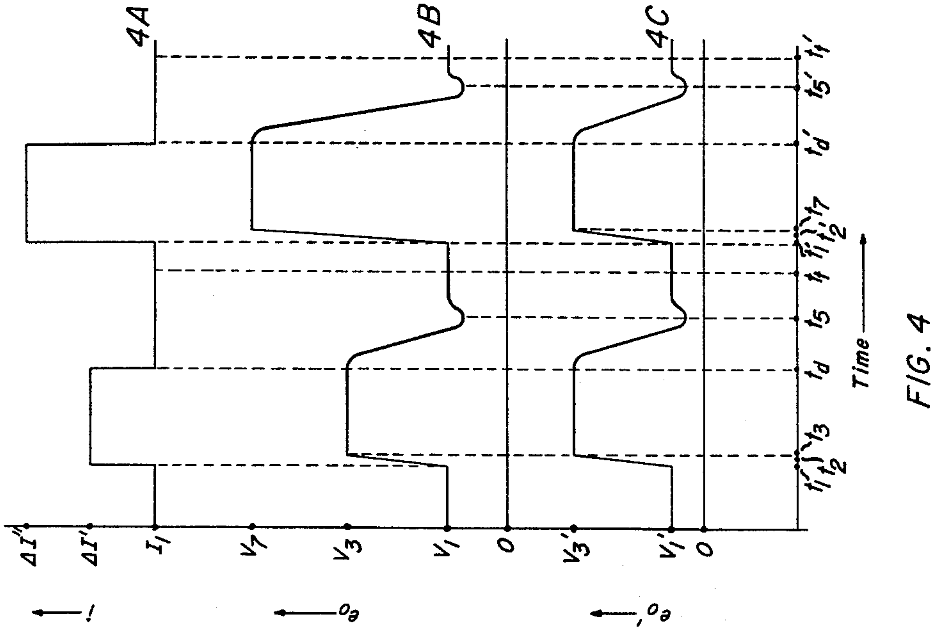
FIGURE 4 illustrates input and output signal wave forms of the circuit of FIGURE 1 for a composite characteristic of the type shown in FIGURE 3.

FIGURES 4A and 4B further serve to illustrate the foregoing operation. The wave form of FIGURE 4A represents the idealized applied input current pulses $i$ and the wave form of FIGURE 4B illustrates the output signal $e_o$ which is derived at the output terminal 22. In order to facilitate a comparison of FIGURES 4 and 3, the pertinent points on the abscissa which represent time are marked with reference numerals having subscripts that correspond to the respective operating points on the composite characteristic of FIGURE 3.

The first input current pulse which is applied at time $t_1$, as represented on the wave form of FIGURE 4A, has an amplitude $\Delta I'$ and endures until time $t_d$. The output signal which is obtained at the output terminal 22 in response to this input pulse, is seen from FIGURE 4B to be initiated at time $t_1$. From its steady state level $V_1$, the output voltage rises rapidly to the value $V_3$ at time $t_3$ which is equal to the corresponding voltage value represented to a different scale in the abscissa of the composite characteristic of FIGURE 3. This voltage level corresponds to the second stable state of the circuit and is maintained until time $t_d$.

Thereafter the output voltage wave form declines at a rate determined by the circuit time constant until time $t_4$ when the circuit reaches the instability point 4. Subsequently, the circuit switches substantially instantaneously to the operating point 5 which is reached at time $t_5$ after a further decrease in the output voltage. It will be noted that the value of the output voltage at time $t_5$ is below the steady state value $V_1$ and, although it is still positive, it represents the lowest value of the output signal. Subsequently, the output voltage returns to the steady state value $V_1$ representing the first stable state of the circuit, at a rate determined by a circuit time constant. At the termination of the cycle $t_t$, the circuit is again ready to receive an input pulse.

FIGURE 4A further illustrates an input current pulse of amplitude $\Delta I''$ which is seen to be applied at time $t_1'$ following $t_t$. The output voltage, as illustrated in FIGURE 4B, is seen to rise from $V_1$ at time $t_1'$ to the level corresponding to the instability peak point 2 and then to the voltage level $V_7$ at time $t_7$. The latter level corresponds to the operating point 7 and represents the third stable state of the circuit. The output voltage remains at this level until time $t_d'$ when the input pulse ceases. Thereafter, the output voltage declines at the time constant rate to the valley instability point 8 and switches substantially instantaneously to the operating point 5 which is reached at time $t_5'$. As before, the output voltage falls below the steady state level $V_1$ at time $t_5'$ but thereafter, it rises at the time constant rate to the $V_1$ level.

When the latter is reached at time $t_t'$ the circuit is again in its first stable state and is ready for aonther input pulse of the same amplitude or of amplitude $\Delta I'$.

It will be apparent from the foregoing explanation that the choice of the three stable operating points 1, 3 and 7 respectively, depends on the applied trigger pulse which represents a unique combination of pulse polarity and amplitude. Thus, if the steady state operation of the circuit is chosen at the stable point 1, circuit operation at the point 1 is evidently maintained by applying an input pulse of zero amplitude. Circuit operation at the stable operating point 3 is selected by applying a positive input pulse having an amplitude $\Delta I'$, while circuit operation at the stable operating point 7 is chosen by applying a positive input signal of amplitude $\Delta I''$. These input signals may, of course, be applied in any desired sequence so that the stable state of the circuit may be changed at will. For example, by applying successive input pulses having an amplitude $\Delta I'$, the circuit is switched back and forth between its first and second stable states. Similarly, the circuit may be switched back and forth successively between its first and third stable states by applying successive pulses of amplitude $\Delta I''$.

The input pulses $\Delta I'$ and $\Delta I''$ which are represented in FIGURE 4A may each represent the resultant pulse obtained upon the coincidence of two or more pulses. The input conditions will depend entirely on the logic function which is performed by the over-all circuit. Thus, in the case of a circuit having three input legs, it may require the coincidence of two pulses to reach the level $\Delta I'$ in order to switch the circuit from its first stable state to its second, while three input pulses may be required to reach the level $\Delta I''$ so as to switch the circuit to its third stable state. The use of self-resetting tunnel diode circuits to perform such logic functions is discussed in detail in a copending application of the inventor herein, Serial Number 68,884, filed on November 14, 1960, and assigned to the assignee of this application, now abandoned.

In the operation which is illustrated in FIGURES 4A and 4B, the circuit always reverts to the initially chosen steady state, i.e., the first stable state, before it switches to another state. This condition is not essential to the operation of the circuit and may be changed by the application of suitable input signals. Thus, in the above-mentioned example of the circuit which has three input legs, let it be assumed that two of the input legs are active, i.e., that they have pulses applied thereto so as to switch the circuit from point 1 to point 3 and to maintain it at the latter. If now, while the aforementioned two input legs are active, the third leg becomes active, the circuit will be driven to the instability peak point 6 and will assume its third stable state by switching substantially instantaneously to the operating point 7 without reverting to the steady state conditions. Actually, in the latter case, the diode 16 switches while the diode 18 is in its switched state. The resultant output voltage wave form therefor rises directly from the level $V_3$ to $V_7$ without reverting to $V_1$.

It follows, that the circuit is also able to switch from its third stable state directly to the second stable state without shifting back to the first stable state. This may be carried out in the example discussed above by terminating the input signal applied to one of the aforementioned three input legs while the other two legs remain active. The output votlage level then decreases from $V_7$ to $V_3$ without reverting to $V_1$.

As previously explained, the stable operating conditions of the circuit represented by the points 1, 3 and 7 respectively, are selected by the applied trigger pulse which represents a unique combination of polarity and amplitude. The significance of the latter requirement will be understood from the following discussion of the circuit operation in which the applied input trigger pulses will be assumed to be voltage pulses in order to illustrate the ability of the circuit to operate with a voltage input source. By a suitable choice of the resistive impedance 10 and the applied bias voltage, the load line B is selected. The steady state condition of the circuit now occurs at the stable operating point 3 which represents the intersection of the load line B and the composite characteristic in the positive resistance region III. The diode 18 is now in its switched state and the diode 10 is in its non-switched state. Under these conditions, the application of an input pulse having zero amplitude maintains the circuit in the stable condition represented by the operating point 3 which has corresponding current and voltage levels $I_3$ and $V_3$ respectively.

In order to shift the circuit operation to point 1, a negative voltage pulse must be applied sufficiently large to cause the diode current to decrease below the level $I_V$ which corresponds to the instability valley point 4 and to cause the applied voltage to decrease below $V_2$. Upon the application of such a negative voltage input pulse, the operation of the circuit shifts rapidly to the instability point 4 and then switches substantially simultaneously to point 5 in the positive resistance region I. Both diodes are now in their non-switched state. If the algebraic sum of the applied negative voltage pulse and of the steady state level $V_3$ is equal to $V_1$, the circuit operation subsequently shifts to point 1 which corresponds to the latter voltage level. The circuit thus operates in one of its stable states and is maintained there until the termination of the applied negative voltage pulse. When the latter occurs, the diode current rises at the time constant rate toward the level $I_3$ which corresponds to what is now the steady state point 3. Upon reaching the peak instability point 2, the circuit operation switches substantially instantaneously back to point 3. The circuit is now ready to accept another input pulse.

With the steady state condition of the circuit chosen at point 3, a positive voltage input pulse is required in order to switch the circuit to the stable operating condition represented by point 7. The operation is similar to that described above in connection with the switching of the circuit from point 1 to point 3. Thus, upon the application of a positive voltage input pulse of the same amplitude as the previously described negative input pulse, the circuit operation shifts rapidly to the peak instability point 6 and thereafter switches substantially simultaneously to the operating point 7. The combined amplitude of $V_3$ and of the applied voltage pulse maintains the circiuit operation in its present stable state. Upon the termination of the positive voltage pulse, the operating point shifts at the circuit time constant rate to the valley instability point 8 and subsequently switches to point 9 in the positive resistance region III. Thereafter, as a result of the applied steady state voltage $V_3$, the diode current increases at the time constant rate until the circuit is back at its steady state operating point 3. It will be evident from the foregoing explanation that the output pulses derived at the terminal 22 will be negative or positive, depending upon the polarity of the applied input pulses. For the example chosen, the amplitude of the output pulses will be the same regardless of polarity. Although the steady state level of the output signal is now $V_3$, the three stable output signal levels $V_1$, $V_3$ and $V_7$ are the same as before.

The stable operating point 7 may also be selected as the steady state point of the circuit by a suitable choice of the resistive impedance 10 and of the applied DC bias so as to obtain the load line C. In this case, negative input pulses of different amplitudes are required in order to switch the circuit to the stable operating points 3 and 1 respectively. Based on the foregoing explanation, the operation of the circuit for such a biasing condition will be evident to those skilled in the art.

In the illustrated embodiment of the invention, output pulses having three unique polarity and amplitude combinations are obtained in response to corresponding input pulses. The output signal $e_o$ which appears at the output terminal 22 may therefore be referred to as tristable in accordance with the three stable voltage levels which it may have. Provided $I_6$ is greater than $I_2$, as shown in FIGURE 3, the circuit is also capable of providing a bistable output signal $e_o'$ between the output terminal 24 and ground. This is made possible by the fact that the output signal $e_o'$ is dependent only upon the condition of the single tunnel diode 18, so that $n+1$ is equal to two stable states. If, as previously assumed, the instability points 2 and 4 correspond to the diode 18, the application of a positive input signal of amplitude $\Delta I'$ is sufficient to switch the diode, the wave form of the output signal $e_o'$ for these conditions is illustrated in FIGURE 4C. The steady state voltage $V_1'$ is less than $V_1$ by the amount of the voltage drop which exists across the diode 16. Upon the application of a positive input pulse $\Delta I'$, the positive output pulse which appears at the terminal 24 from $t_1$ to $t_t$ has an amplitude $V_3'$. While the relative pulse amplitude is equal to that obtained at the terminal 22, the absolute pulse amplitude $V_3'$ is less by an amount which is equal to the voltage drop across the diode 16.

The output signal $e_o'$ which is obtained at the terminal 24 remains the same if an input pulse of amplitude $\Delta I''$ is applied to the input terminal 20 from $t_1'$ to $t_d'$ since the action of the diode 16 does not affect the signal $e_o'$. The diode 18 again switches and, as shown in FIGURE 4C, an output pulse of amplitude $V_3'$ appears at the output terminal 24 between $t_1'$ and $t_t'$. Accordingly, a bistable output signal $e_o'$ is obtained in response to the tristable input signal that is applied to the input terminal 20, the two stable states being represented by the voltage levels $V_1'$ and $V_3'$ respectively.

If the instability points 6 and 8 of the composite diode characteristic are the ones which correspond to the diode 18 in FIGURE 1, the output signal $e_o'$, although still bistable, will be different from the case discussed above. Assuming again that the steady state operation of the circuit occurs at point 1 of the composite characteristic, the application of a positive input pulse having an amplitude $\Delta I'$, even though it switches the diode 16, produces no change at the terminal 24 since the diode 18 remains in its original state. Accordingly, the output signal $e_o'$ continues at the level $V_1$. If a positive input pulse having an amplitude $\Delta I''$ is applied, however, the diode 18 switches and produces a positive output pulse having an amplitude $V_3'$. The amplitude of the output pulse will be the same as that obtained in the case discussed above where the diode 18 is switched by a positive input pulse of amplitude $\Delta I'$. Accordingly, different logical operations are possible with the signal $e_o'$, depending upon which one of the tunnel diodes has the lower peak current.

As previously explained, the invention is not limited to a tristable circuit, and the number of possible stable circuit states may be increased by increasing the number of tunnel diodes in accordance with the previously stated relationship $n+1$ where $n$ is the number of like-poled, series-connected diodes across which the output signal is derived. It will be evident, that that addition of one or more diodes in series between the cathode of the diode 18 and ground will also increase the number of stable levels of the output signal $e_o'$. The practical limits of the number of series diodes which may be so connected in series depend on the tolerances required with respect to the peak and trigger currents and the peak-to-valley ratios of the diodes. Since output signals with different numbers of stable voltage levels may be derived between the anodes of the respective diodes and ground, it is possible to cascade logical circuits which have different numbers of stable states and thereby greatly enhance the flexibility of the invention. Since the presence of the inductive impedance 12 ensures sufficient logical gain to permit different multi-stable output signals to be derived simultaneously, the circuit which constitutes the subject matter of this invention provides a powerful tool for performing different kinds of logic functions.

The foregoing discussion was limited to tunnel diodes which, although they have different peak current levels, have substantially the same valley current level for identical voltage swings. As a result, the diodes have different peak-to-valley current ratios. Such a circuit is apt to be more reliable than one in which the peak current levels of the diodes differ while the peak-to-valley current ratio remains the same. In the latter case, when the operating point shifts from the positive resistance region V to region I, under certain adverse conditions the possibility exists for it to be delayed briefly in the region III so as to give rise to parasitic oscillations.

Figure 5:
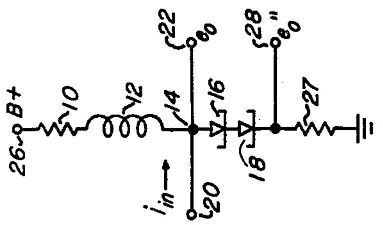
FIGURE 5 illustrates a modification of the embodiment of FIGURE 1.

Although a circuit with diodes having substantially the same valley current level is preferable, the use of diodes with different valley currents is nevertheless feasible. A circuit of the latter kind is shown in FIGURE 5, which illustrates a modification of the circuit of FIGURE 1. Applicable reference numerals have been retained wherever possible. A resistive impedance 10 and an inductive impedance 12 are connected in series between a terminal 26 and a junction point 14, the input terminal 20 and the output terminal 22 both being directly connected to the junction point. A D.C. bias source B+ is connected between the terminal 26 and ground. A pair of like-poled diodes 16 and 18 are connected in series with each other, the anode of the diode 16 being connected to the junction point 14. A resistive impedance 27 is connected between the cathode of the diode 18 and ground. An output terminal 28 is connected to the cathode of the tunnel diode 18 and is adapted to provide an output signal $e_o''$.

Figure 6:
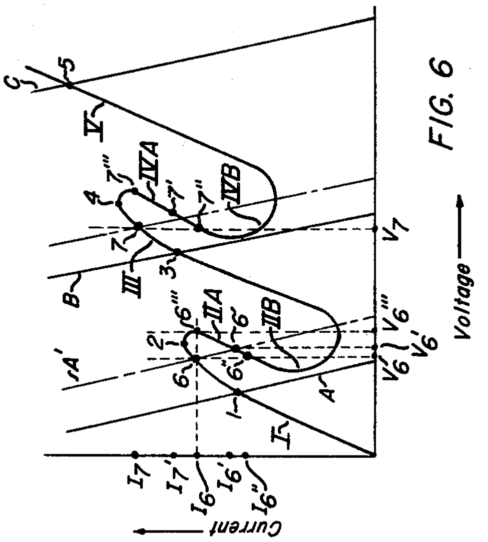
FIGURE 6 illustrates the composite characteristic of the circuit of FIGURE 5 for tunnel diodes with different characteristics.

The presence of the resistive impedance 27 is seen to distort the composite characteristic of the circuit of FIGURE 5, as shown in exaggerated manner in FIGURE 6. While the positive resistance regions I, III and V respectively remain relatively unaffected, the resistance ranges II and IV are sufficiently modified so that they now contain limited positive resistance regions. The latter are designated as IIA and IVA in FIGURE 6, while the negative resistance regions are designated as IIB and IVB.

If the applied bias voltage is such that the load line A intersects the positive resistance region I at the point 1, the operation of the circuit is substantially the same as that described in connection with the embodiment of FIGURE 1. The application of a positive input pulse of a first amplitude drives the circuit to the stable operating point 3 in the positive resistance region III, while the application of a positive input pulse of a second and greater amplitude drives the circuit to the stable operating point 5 in the positive resistance region V. Corresponding positive output pulses are derived at the output terminal 22.

A logically inverted output signal $e_o''$ is obtained from the output terminal 28. Specifically, a negative output pulse whose amplitude is equal to the difference in the stable currents flowing in the resistor 27 times the resistance value of the latter will appear across the resistor 27 in response to a positive input pulse sufficient to drive the circuit to the stable operating point 3. A negative output pulse of a larger amplitude will appear at the output terminal 28 in response to a positive input pulse sufficient to drive the circuit operation from the steady state operating point 1 to the stable operation point 5. The theory of operation of tunnel diode inverter circuits is more fully explained in the above-mentioned copending applications of the inventor herein, Serial Number 68,882 and Serial Number 68,883.

The operation of the circuit of FIGURE 5 also follows that discussed in connection with the embodiment of FIGURE 1 when the load line B is chosen so that the steady operating conditions of the circuit occur at point 3. Similarly, the choice of the load line C, which places the steady state conditions of the circuit at point 5 of the composite characteristic, causes the circuit to operate in the manner explained above in connection with FIGURE 1.

Owing to the positive resistance region IIA of the resistance range II in FIGURE 6, the application of a steady state voltage $V_6$ provides two distinct current values $I_6$ and $I_6''$. Similarly, a given current value in this region, e.g., $I_6$, corresponds to two distinct voltage values $V_6$ and $V_6'''$ respectively. If a load line A' is chosen, the composite characteristic is intersected in two distinct positive resistance regions I and IIA respectively, separated from each other by the instability peak point 2. Accordingly, an additional stable state of operation may be obtained with such a circuit by a proper choice of the circuit load line.

For example, if the circuit is biased to the steady state operating point 6, a positive current pulse applied to the input terminal 20 will shift the circuit operation beyond the instability point 2. Ordinarily, the circuit would shift either to point 3 or to point 5 in the positive resistance regions III and V respectively, depending upon the amplitude of the applied current pulse and provided the voltage across the diode combination is sufficiently large so that both the current as well as the voltage requirements which prevail at these stable points are satisfied. If the voltage across the series diode combination is of the order of $V_6'$, it is inadequate to sustain stable operation in either one of the positive resistance regions III or V. However, the voltage under these conditions is sufficient to sustain operation at the point 6' which is located in the positive resistance region IIA of the resistance range II.

Similar conditions obtain with respect to the composite range IV which has a positive resistance portion IVA. The corresponding points on the characteristic are designated as 7, 7', 7'' and 7''' respectively. It will be clear from the foregoing explanation that by a suitable choice of the load line, the circuit of FIGURE 5 may be transformed from a tristable circuit to a circuit which has five stable operating conditions.

The principles of the invention herein are not confined to self-resetting circuits, but are also applicable to circuits which require a separate reset signal. For example, in the absence of an inductance and using a bias source with a very high internal resistance, the circuit of FIGURE 1 will still retain its tristable properties. Although the circuit, as modified, will have very high gain, it will be incapable of resetting itself. The high impedance bias source will provide a circuit load line which is nearly horizontal and whose intersection with the three positive resistance regions of the composite characteristic of FIGURE 3 will determine three stable operating points which have substantially the same current level. Circuit reset is obtained in this case by applying a separate resetting signal to the junction point 14, preferably from a three-phase clock system.

As explained above, the invention is not limited to a single pair of diodes but may, within the practical limits set forth, include any desired number of like-poled diodes connected in series combination, depending on the number of stable states required. Either a voltage source or current source may be used to supply the input pulses, but identical diodes will operate without ambiguity only if triggered from a voltage source. The output signal may be obtained either directly between the anode of the first diode and ground or, in the case of a circuit which includes a cathode resistor, the inverted output signals may be derived across the latter. Alternatively, if diodes having different peak currents are used, output signals may be derived between any anode and ground.

By a suitable choice of the load line it is possible to operate the circuit with single-polarity signals or with signals having two polarities. Where the respective tunnel diodes have different peak current levels, the only requirement on the input pulse is that each pulse be representative of a unique polarity and amplitude combination. Further, as explained above, the circuit may be operated in a manner whereby it does not revert to its steady state conditions in order to shift from one stable state to another. In view of the logical gain which is provided by the invention, it is possible to drive more than one logical circuit with a single input signal. The circuit which is driven from an output terminal other than the one connected to the anode of the first diode need not have the same number of stable operating conditions as the driver circuit. Although a single resistive impedance 10 and a single inductive impedance 12 are shown in the circuit FIGURES 1 through 5, the invention is not so limited and an equivalent reactive impedance may be substituted. The impedances 10 and 12 may also be interchanged without affecting the operation of the circuit.

It will be apparent from the foregoing discussion that numerous modifications, changes and equivalents will now occur to those skilled in the art, all of which fall within the true spirit and scope contemplated by the invention.

What is claimed is:

1. A self-resetting, multistable circuit for performing logical functions comprising a resistive and an inductive impedance connected in series combination and having one terminal connected to a junction point, a plurality of tunnel diodes connected in series combination between said junction point and a reference point, each of said diodes having a characteristic including a pair of positive resistance regions each adjacent an instability point, said individual diode characteristics forming a composite characteristic of said series-connected diodes adapted to provide a plurality of stable diode operating regions, means for applying a bias voltage between the other terminal of said series impedance combination and said reference point adapted to provide monostable diode operation at an initially chosen one of said stable operating regions, means for selectively applying input trigger pulses having selectively different levels of amplitude to said junction point each adapted to shift said circuit to a different one of said stable operating regions and to substantially maintain it there for the pulse duration, said circuit being adapted to return to said initially chosen stable operating region upon the termination of each of said trigger pulses, and means for deriving output signals from said circuit between at least one of said diodes and said reference point.

2. A self-resetting, multistable circuit for performing logical functions comprising a resistive and an inductive impedance connected in series combination and having one terminal connected to a junction point, a plurality of tunnel diodes connected in series between said junction point and a reference point, each of said diodes having a characteristic including a pair of positive resistance regions each adjacent an instability point, said individual diode characteristics forming a composite characteristic of said series-connected diodes adapted to provide a plurality of stable diode operating regions, at least one of said instability points associated with each diode having a unique current level, means for applying a bias voltage between the other terminal of said series impedance combination and said reference point to provide monostable diode operation at an initially chosen one of said stable operating regions, means for selectively applying input trigger pulses having selectively different levels of amplitude to said junction point each adapted to shift said circuit to a different one of said stable operating regions and to substantially maintain it there for the pulse duration, said circuit being adapted to return to said initially chosen stable operating region in response to the termination of each of said trigger pulses, and means for deriving output signals from said circuit between at least one of said diodes and said reference point.

3. A self-resetting, multistable circuit for performing logical functions comprising a resistive and an inductive impedance connected in series combination and having one terminal connected to a junction point, $n$ like-poled tunnel diodes connected in series between said junction point and a reference point, each of said diodes having a characteristic including a pair of positive resistance regions each adjacent an instability point, said individual diode characteristics forming a composite characteristic of said series-connected diodes adapted to provide $n+1$ stable diode operating regions, means for applying a bias voltage between the other terminal of said series impedance combination and said reference point to provide monostable diode operation at an initially chosen one of said stable operating regions, means for selectively applying trigger pulses having selectively different levels of amplitude to said junction point each adapted to shift said circuit to a different one of said stable operating regions for the pulse duration, said circuit being adapted to return to said initially chosen stable operating region in response to the termination of each of said trigger pulses, and means for deriving output signals from said circuit at least between one of said diodes and said reference point.

4. A circuit for performing logical functions comprising, a plurality of diodes connected in series combination with the same polarity, each of said diodes having a characteristic including a pair of positive resistance regions each adjacent an instability point, said individual diode characteristics forming a composite characteristic of said series combination adapted to provide different stable operating regions, means for resistively coupling a bias voltage to said series combination adapted to provide monostable diode operation at an initially chosen one of said stable operating regions, and means for applying trigger pulses having selectively different levels of amplitude to said junction point to shift the circuit operation to selected ones of said stable operating regions.

5. A circuit for performing logical functions comprising, a plurality of diodes connected in series combination, each of said diodes having a characteristic including a pair of positive resistance regions each adjacent an instability point, said individual diode characteristics forming a composite characteristic of said series combination adapted to provide different stable operating regions, at least one of said instability points associated with each diode having a unique current level, means for resistively coupling a bias voltage to said series combination to provide monostable diode operation at an initially chosen one of said stable operating regions, and means for applying input pulses having selectively different levels of amplitude to said junction point to shift the circuit operation to selected ones of said stable operating regions.

6. A circuit for performing logical functions comprising, a resistive and an inductive impedance connected in series combination and having one terminal connected to a junction point, a plurality of tunnel diodes connected in series combination between said junction point and a reference point, each of said diodes having a characteristic including a pair of positive resistance regions each adjacent an instability point, said individual diode characteristics forming a composite characteristic of said series combination adapted to provide a plurality of stable operating regions, one of said instability points associated with each diode having a unique peak current level, means for applying a bias voltage between the other terminal of said series impedance combination and said reference point to provide monostable diode operation at an initially chosen one of said stable operating regions, and means for applying input trigger pulses having selectively different levels of amplitude to said junction point to shift the circuit operation to selected ones of said stable operating regions.

7. A circuit for performing logical functions comprising, a plurality of diodes connected in series combination, each of said diodes having a characteristic including a pair of positive resistance regions each adjacent an instability point, said individual diode characteristics forming a composite characteristic of said series combination adapted to provide different stable diode operating regions, means for resistively coupling a bias voltage to said series combination to provide monostable diode operation at an initially chosen one of said stable operating regions, a trigger source for deriving input pulses having selectively different levels of amplitude, and means for applying said trigger pulses to said junction point to shift the circuit operation to selected ones of said stable operating regions.

8. A self-resetting, multistable circuit for performing logical functions comprising a resistive and an inductive impedance connected in series combination and having one terminal connected to a junction point, *n* like-poled tunnel diodes connected in series with each other, the anode of the first one of said series-connected diodes being connected to said junction point and the cathode of the last one of said diodes being connected to said reference point, each of said diodes having a characteristic including a pair of positive resistance regions each adjacent an instability point, said individual diode characteristics forming a composite characteristic of said series-connected diodes adapted to provide $n+1$ stable diode operating regions, one of the pair of instability points associated with each diode having a unique peak current level, the other one of each pair of instability points having a valley current level which is substantially the same for each of said diodes, means for applying a bias voltage between the other terminal of said series impedance combination and said reference point to provide monostable diode operation at an initially chosen one of said stable operating regions, means for selectively applying *n* input trigger pulses having selectively different levels of amplitude to said junction point each adapted to shift said circuit to a different one of said stable operating regions for the pulse duration, said circiut being adapted to return to said initially chosen stable operating point upon the termination of each of said trigger pulses, and means for deriving output signals from said circuit between at least one of said diodes and said reference point.

9. A circuit for performing logical functions comprising, a first resistive impedance and an inductive impedance connected in series combination and having one terminal connected to a junction point, a second resistive impedance having a linear voltage-current response connected to a reference point, a plurality of tunnel diodes connected in series combination between said junction point and said second resistive impedance, each of said diodes having a characteristic including a pair of positive resistance regions adjacent a pair of instability points, a resistance range intermediate each pair of said instability points including a negative resistance region, at least some of said resistance ranges further including positive resistance regions, said diode series combination having a composite characteristic adapted to provide a plurality of stable diode operating regions, means for applying a bias voltage between the other terminal of said series impedance combination and said reference point to provide monostable diode operation at an initially chosen one of said stable operating regions, and means for applying input trigger pulses having selectively different levels of amplitude to said junction point to shift the circuit operation to selected ones of said stable operating regions.

10. A self-resetting, multistable circuit for performing logical functions comprising a first resistive impedance and an inductive impedance connected in series combination and having one terminal connected to a junction point, a second resistive impedance having a linear voltage-current response connected to a reference point, a plurality of tunnel diodes connected in series between said junction point and said second resistive impedance, each of said diodes having a characteristic including a pair of positive resistance regions adjacent a pair of instability points, a resistance range intermediate each pair of said instability points, including a negative resistance region, at least some of said resistance ranges further including positive resistance regions, said diode series combination having a composite characteristic adapted to provide a plurality of stable diode operating regions, means for applying a bias voltage between the other terminal of said series impedance combination and said reference point to provide monostable diode operation at an initially chosen one of said stable operating regions, means for selectively applying trigger input pulses having selectively different levels of amplitude to said junction point each adapted to shift said circuit to a different one of said stable operating regions and to substantially maintain it there for the pulse duration, said circuit being adapted to return to said initially chosen stable operating region in response to the termination of each of said trigger pulses, and means for deriving output signals from said circuit between at least one of said diodes and said reference point.

11. A self-resetting, multistable circuit for performing logical functions comprising a first resistive impedance and an inductive impedance connected in series combination and having one terminal connected to a junction point, a second resistive impedance having a linear voltage-current response connected to a reference point, a plurality of tunnel diodes connected in series between said junction point and said second resistive impedance, each of said diodes having a characteristic including a pair of positive resistance regions adjacent a pair of instability points, a resistance range intermediate each pair of said instability points including a negative resistance region, at least some of said resistance ranges further including positive resistance regions, said diode series combination having a composite characteristic adapted to provide a plurality of stable diode operating regions each located in one of said positive resistance regions, one of the pair of instability points associated with each diode having a unique peak current level, the other one of each pair of instability points having a valley current level which is substantially the same for each of said diodes, means for applying a bias voltage between the other terminal of said series impedance combination and said reference point to provide monostable diode operation at an initially chosen one of said stable operating regions, means for selectively applying different trigger input pulses to said junction point each representing a different polarity and amplitude combination respectively to shift said circuit to different ones of said stable operating regions for the pulse duration, said circuit being adapted to return to said initially chosen stable operating region in response to the termination of each of said trigger pulses, and means for deriving output signals from said circuit between at least one of said diodes and said reference point.

12. A circuit for performing logical functions comprising, a first resistive impedance and an inductive impedance connected in series combination and having one terminal connected to a junction point, a second resistive impedance having a linear voltage-current response and having one terminal connected to a reference point, a plurality of like-poled tunnel diodes connected in series combination with each other, the anode of the first one of said series-connected diodes being connected to said junction point, the cathode of the last one of said diodes being connected to the other terminal of said second resistive impedance, each of said diodes having a characteristic including a pair of positive resistance regions adjacent a pair of instability points, a resistance range intermediate each pair of said instability points including a negative resistance region at least some of said resistance ranges further including positive resistance regions, said diode series combination having a composite characteristic adapted to provide a plurality of stable diode operating regions located in different ones of said positive resistance regions, means for applying a bias voltage between the other terminal of said series impedance combination and said reference point adapted to provide monostable diode operation at an initially chosen one of said stable operating regions, and means for applying trigger input pulses having selectively different levels of amplitude to said junction point to shift the circuit operation to selected ones of said stable operating regions.

13. A self-resetting, multistable circuit for performing logical functions comprising, a first resistive impedance and an inductive impedance connected in series combination and having one terminal connected to a junction point, a secod resistive impedance having a linear voltage-current response connected to ground, a plurality of like-poled diodes connected in series with each other, the anode of the first one of said series-connected diodes being connected to said junction point, the cathode of the last one of said diodes being connected to said second resistive impedance, each of said diodes having a characteristic including a pair of positive resistance regions adjacent a pair of instability points, one of the pair of instability points associated with each diode having a unique peak current level, the other one of each pair of instability points having a valley current level which is substantially the same for each of said diodes, a resistance range intermediate each pair of said instability points including a negative resistance region, at least some of said resistance ranges further including positive resistance regions, said series-connected diodes having a composite characteristic adapted to provide a plurality of stable diode operating regions each located in one of said positive resistance regions, means for applying a bias voltage between the other terminal of said series impedance combination and ground to provide monostable diode operation at an initially chosen one of said stable operating regions, means for selectively applying different trigger input pulses to said junction point each representing a unique polarity and amplitude combination to shift said diode to different ones of said stable operating regions for the pulse duration, said circuit being adapted to return to said initially chosen stable operating region in response to the termination of each of said trigger pulses, and means for deriving output signals from said circuit between at least one of said diodes and ground.

14. A self-resetting, multistable circuit for performing logical functions comprising, a resistive impedance and an inductive impedance connected in series combination and having one terminal connected to a junction point, *n* like-poled diodes connected in series with each other, the anode of the first one of said series-connected diodes being coupled to said junction point, the cathode of the last one of said series-connected diodes being coupled to ground, each of said diodes having a characteristic including a negative resistance range intermediate a pair of positive resistance regions and separated therefrom by a pair of instability points, one of the pair of instability points associated with each diode having a unique peak current level, the other one of each pair of instability points having a valley current level which is substantially the same for each of said diodes, said series-connected diodes having a continuous composite characteristic adapted to provide $n+1$ stable diode operating regions, each of said stable operating regions being bordered by two instability points, means for applying a D.C. bias voltage between the other terminal of said series impedance combination and ground, said D.C. bias being adapted to define the steady state conditions of said circuit at an initially chosen one of said stable operating regions, means for selectively applying *n* different trigger input pulses to said junction point each representing a unique polarity and amplitude combination, each of said trigger input pulses being adapted to shift said circuit beyond one of said bordering instability points to a selected one of said stable operating regions and to substantially maintain it there for the pulse duration, said circuit being adapted to return to said initially chosen stable operating region in response to the termination of said pulse, and means for deriving an output signal at least between one of said diodes and ground.

15. The apparatus of claim 9 and further including means for deriving a direct output signal between said junction point and ground having a plurality of stable signal levels equal to said plurality of stable diode operating regions.

16. The apparatus of claim 9 and further including means for deriving an inverted output signal across said second resistive impedance having a plurality of stable signal levels equal to said plurality of stable diode operating regions.

17. The apparatus of claim 9 and further including means for deriving a direct output signal between at least one connecting point in said series diode combination and ground, said output signal having a plurality of stable signal levels less than said plurality of stable diode operating regions.

18. The apparatus of claim 12 and further including means for deriving a direct output signal from said junction point, said output signal having a plurality of stable signal levels equal to said plurality of stable diode operating regions.

19. The apparatus of claim 12 and further including means for deriving an inverted output signal from said other terminal of said second resistive impedance, said output signal having a plurality of stable signal levels equal to said plurality of stable diode operating regions.

20. The apparatus of claim 12 and further including means for deriving a direct output signal from the cathode-anode connection of at least one pair of said tunnel diodes, said output signal having a plurality of stable signal levels less than said plurality of stable operating regions.

References Cited by the Examiner

UNITED STATES PATENTS

| | | | |
|---|---|---|---|
| 3,069,564 | 12/62 | De Lange | 307—88.5 |
| 3,119,936 | 1/64 | Bergman | 307—88.5 |

OTHER REFERENCES

The International Solid-State Circuits Conference Digest of Technical Papers (FIG. 7 of page 53, Session V, entitled "Information Storage Techniques," held on February 11, 1960, relied upon).

I.R.E. Wescon Convention Records, vol. 3, Part 3, page 24, August 21, 1959 (by Lesk et al.).

JOHN W. HUCKERT, *Primary Examiner.*

HERMAN KARL SAALBACH, ARTHUR GAUSS, *Examiners.*